United States Patent [19]

Duperray

[11] Patent Number: 5,578,555
[45] Date of Patent: Nov. 26, 1996

[54] METHOD OF MONITORING THE FABRICATION OF BI-2223 MATERIAL HAVING A HIGH CRITICAL TEMPERATURE

[75] Inventor: Gérard Duperray, La Norville, France

[73] Assignee: Alcatel Alsthom Compagnie Generale d'Electricite, Paris Cedex, France

[21] Appl. No.: 348,063

[22] Filed: Nov. 23, 1994

Related U.S. Application Data

[63] Continuation of Ser. No. 950,209, Sep. 24, 1992, abandoned.

[30] Foreign Application Priority Data

Sep. 30, 1991 [FR] France .................................. 91 11990

[51] Int. Cl.$^6$ ........................ H01B 12/00; C04B 35/622; C04B 35/653
[52] U.S. Cl. ........................ 505/450; 505/725; 505/782; 505/310; 505/501; 252/521
[58] Field of Search ................................. 252/518, 521; 505/100, 725, 782, 310, 501, 726, 450

[56] References Cited

U.S. PATENT DOCUMENTS 5,189,011 2/1993 Itozaki et al. ............................. 505/1

OTHER PUBLICATIONS

Chemical Abstracts, vol. 112, No. 14, Apr. 2, 1990, Columbus, Ohio, US; abstract No. 130159A, V. Boffa et al.: 'Effects Of Sintering Conditions On The Transport Properties Of Yttrium Barium Copper Oxide Pellets'.
Journal Of Materials Science, vol. 25, No. 11, Nov. 1990, London, Great Britain, pp. 4852–4855; D. Bahadur et al.: "Effect Of Optimum Thermal Treatment On BiSrCaCu$_2$O$_y$ Experimental Procedure".
Japanese Journal of Applied Physics, vol. 28, No. 5, May 1989, Tokyo, Japan, pp. 772–774; S. Kobayashi et al.: "The Effect Of Sintering Conditions On the Formation Of The High–Tc Phase In The Bi–Sr–Ca–Cu–O System".
Journal Of Vacuum Science & Technology, vol. 9, No. 3, Jun. 1991, US, pp. 394–400; L. M. Chen et al: "Studies Of The Behavior Of The '123' Superconductor System During Changes In Atmospheric Conditions".
Ratto "Monitoring Sintering/densification and Crystallization/grain–growth . . ." *Jap. Jnl. Appl Phys.* v. 29(2) Feb. 1990 pp. 244–251.
Inoue "Superconductive Transition at 120K in a Ti–Bi–Sr–Ca–Cu–O . . ." *Jap Jnl Appl Phys.* v. 28(7) Jul. 1989 pp. L1167–L1170.
Rong-ying "The Specific heat of the single–phase (Bi, Pb)$_2$Sr$_2$Ca$_2$Cu$_3$O$_{10}$ . . ." *Physica C* v. 158 1989 pp. 255–257 no month available.
Che et al. "Composition & Superconductivity in Bi–Sr–Ca–Cu–O . . ." Journ of Mat. Science vol. 24, May 1989 pp. 1725–1728.

*Primary Examiner*—Douglas J. McGinty
*Assistant Examiner*—M. Kopec
*Attorney, Agent, or Firm*—Sughrue, Mion, Zinn, Macpeak & Seas

[57] ABSTRACT

A method of monitoring the fabrication of a superconductive material having a high critical temperature is wherein:

the starting material is a mixture of powders of precursors for said material having stoichiometric proportions appropriate for the desired superconductive phase;

the said mixture is agglomerated to form a tubular or a cylindrical piece;

the agglomerated piece is placed in a controlled-atmosphere oven for synthesizing said superconductive phase;

the conductivity of said piece is measured continuously;

the temperature at which conductivity begins to decrease is exceeded and then the temperature is returned to a value where conductivity begins to increase; and the temperature of the oven is permanently adjusted so that said conductivity does not decrease.

5 Claims, 5 Drawing Sheets

METHOD OF MONITORING THE FABRICATION OF BI-2223 MATERIAL HAVING A HIGH CRITICAL TEMPERATURE

This is a continuation of application Ser. No. 07/950,209 filed Sep. 24, 1992, now abandoned.

The present invention relates to a method of monitoring the fabrication of a superconductive material having a high critical temperature.

BACKGROUND OF THE INVENTION

It is known that high critical temperature superconductive materials with compositions that generally satisfy the formulae:

$$Ln_2Ba_4Cu_{(6+n)}O_{(14-n)}$$

or $$(BP)_2Sr_2Ca_nCu_{(1+n)}O_{(6+2n)}$$

where
Ln=lanthanide
BP=Bi; $Bi_{(1-x)}Pb_x$; Tl
n=0; 1; 2 have the characteristic of presenting narrow ranges of thermodynamic stability. Thus, during synthesis, if the parameters are not within the proper ranges, mixtures are obtained in which the looked-for superconductive phase is embedded in unwanted superconductive phases having low critical temperature and in other parasitic compounds.

In addition to thermodynamic parameters (oxygen pressure, stoichiometry, and temperature), other parameters act dynamically on synthesis: homogeneity, division state, compacting and purity of the precursor reagents, gas flow distribution, temperature profile as a function of time, involuntary gradients in the treatment oven, and reaction time.

To take account of this state of affairs, operators performing such synthesis proceed as follows: while monitoring the parameters closely, they begin with prior optimization of the material used by varying one of the parameters; then while fixing the parameters as much as possible to the values determined in this way, they perform synthesis in a manner that is reproducible to a greater or lesser extent.

That method suffers from several drawbacks:
it is lengthy and fiddly;
it may fail utterly if a parameter should vary due to involuntary drift: aging of the material; changes in the raw materials; a change of operator, etc.;
it is necessary to wait until all of the operations have been completed before finding out whether or not the product is satisfactory.

An object of the present invention is to seek monitoring means for enabling the operator to track proper operation of synthesis in real time, and in particular for providing a warning at the beginning of any anomaly; it should also be possible to correct synthesis immediately by modifying a parameter such as temperature, oxygen partial pressure, or reaction time.

SUMMARY OF THE INVENTION

The present invention provides a method of monitoring the fabrication of a superconductive material having a high critical temperature, e.g.:

$$Ln_2Ba_4Cu_{(6+n)}O_{(14-n)}$$

or $$(BP)_2Sr_2Ca_nCu_{(1+n)}O_{(6+2n)}$$

where
Ln=lanthanide
BP =Bi; $Bi_{(1-x)}Pb_x$; Tl
n=0; 1; 2
wherein:
the starting material is a mixture of powders of precursors for said material having stoichiometric proportions appropriate for the desired superconductive phase;
the said mixture is agglomerated to form a tubular or a cylindrical piece;
the agglomerated piece is placed in a controlled-atmosphere oven for synthesizing said superconductive phase;
the conductivity of said piece is measured continuously;
the temperature at which conductivity begins to decrease is exceeded and then the temperature is returned to a value where conductivity begins to increase; and
the temperature of the oven is permanently adjusted so that said conductivity does not decrease.

During the initial temperature rise, while the superconductive phase is beginning to be formed, conductivity begins to appear and increases with temperature; as soon as a sudden drop in conductivity occurs, it is necessary to stop the rise in temperature since partial melting of the piece has begun, which corresponds to ideal conditions for continuing the synthesis. The reaction then continues and the conductivity again begins to increase as a function of time. It is then possible to cause the temperature to increase until a new turning point of decreasing conductivity is reached.

Thus, as the reaction progresses, or because of an involuntary change in the oxygen partial pressure, temperature is corrected to remain at the limit of a turning point where conductivity begins to increase.

Although conductivity normally increases as the concentration of the synthesized phase increases, it is observed that the turning point that may appear becomes more and more pronounced, in other words the temperature range for obtaining a perfect phase becomes narrower and narrower.

Preferably, the precursors used are selected from:
$Ln_2O_3$ where Ln represents a lanthanide
$BaCO_3$
$SrCO_3$
$CaCO_3$ or CaO
$Bi_2(CO_3)_3$ or $Bi_2O_3$
$PbCO_3$ or PbO or $Pb_3O_4$.

The method of the invention is particularly advantageous for making the superconductive phase $Bi_2Sr_2Ca_2Cu_3O_{10}$ which is normally irreversibly degraded by the formation of $(CaSr)_2CuO_3$ and $Bi_2Sr_2CuO_6$, which degradation is accompanied by a collapse of conductivity.

Conductivity is preferably measured by the "four point" method, i.e. a method that requires four contact points. A current is thus established between the two extreme contacts and the resistive drop through said piece is measured between two other contacts which are situated on the path of said current.

Said contacts are made of metals that do not react with the reagents present or with the products of the synthesis. It is preferable to select silver, platinum, rhodium, or gold. They may be in the form of a varnish deposited on the surface of said piece, or in the form of wires embedded in said piece, or in the form of collars, or in the form of springs pressing against said piece.

BRIEF DESCRIPTION OF THE DRAWINGS

Implementations of the invention are described by way of example with reference to the accompanying drawings, in which.

DETAILED DESCRIPTION

EXAMPLE I

A previously ground mixture of $Bi_2O_3$, $PbCO_3$, $SrCO_3$, $CaCO_3$ and $CuO$ in stoichiometric proportions corresponding to:

$$Bi_{1.6}Pb_{0.4}Sr_2Ca_2Cu_3O_{10}$$

was compressed isostatically in the form of a bar having a diameter of 5 mm and a length of 50 mm. Four contacts in the form of silver wire collars were disposed on said bar. The assembly was placed in an oven on a refractory support provided with four platinum conductors enabling the contacts on the bars to be connected to a current generator and to a millivoltmeter.

The flow rates of nitrogen and of oxygen were adjusted to sweep 50 liters per hour through the oven at an oxygen content of 10%.

The temperature was raised to 800° C. at 120° C. per hour and then to 840° C. at 30° C. per hour.

Figure 1:
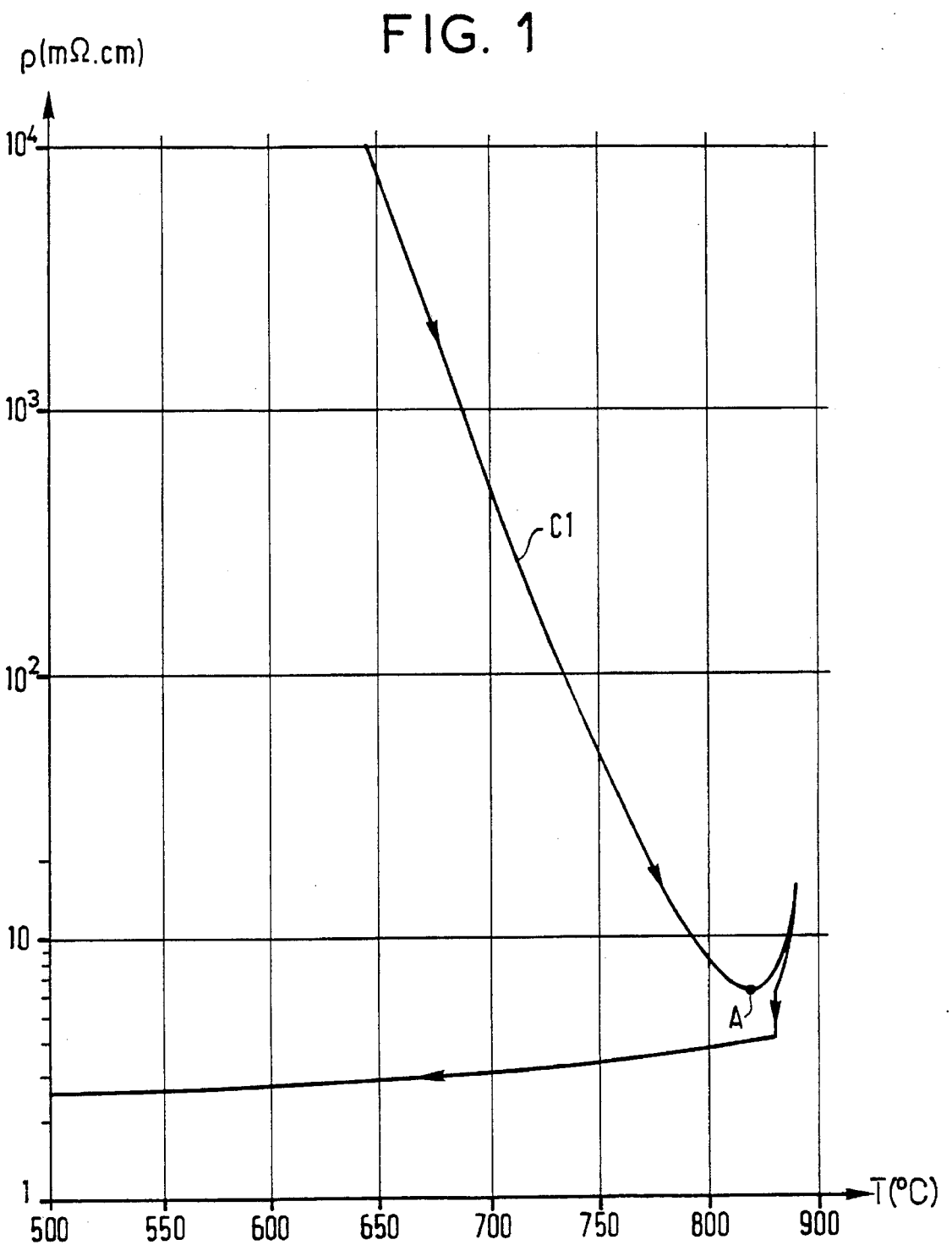
FIG. 1 is a graph showing how resistivity varies as a function of temperature in a material treated using the method of the invention.

Curve C1 in FIG. 1 shows how resistivity p(mΩ.cm) varies as a function of temperature T (° C.).

It can be seen that resistivity decreased regularly down to a point A with a turning point that begins around 820° C. Temperature was then reduced to a 830° C. and baking was continued under steady conditions for 67 hours at 830° C. Resistivity continued to decrease. The bar was then cooled to ambient temperature at 120° C. per hour under pure oxygen.

Figure 2:
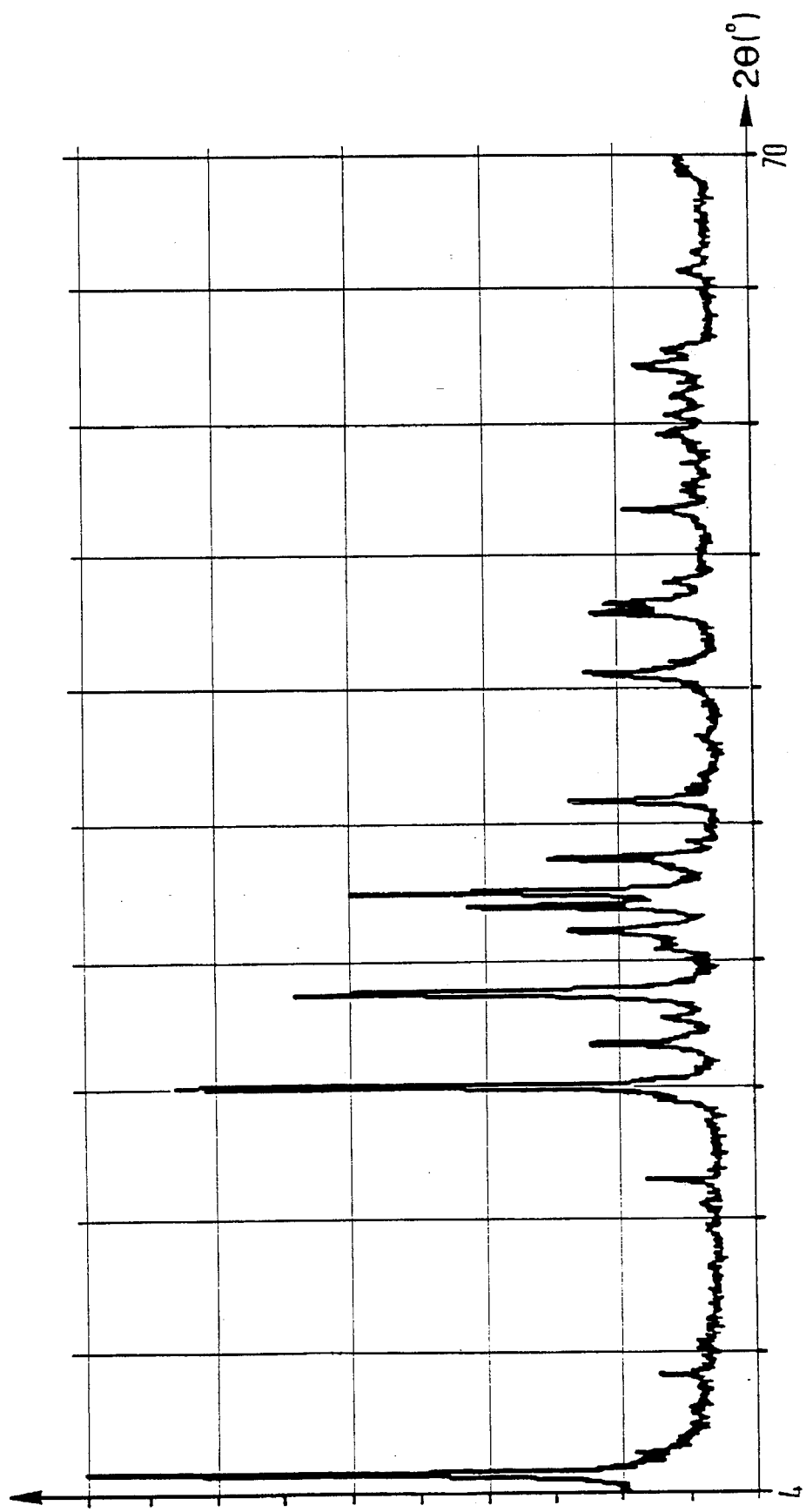
FIG. 2 shows an X-ray diffraction spectrum corresponding to the material associated with FIG. 1.

The resulting material was subjected to X-ray diffraction analysis. The spectrum shown in FIG. 2 has diffraction angle 2θ plotted along the abscissa. It can be seen that the material contains about 85% of the $Bi_2Sr_2Ca_2Cu_3O_{10}$ phase.

Figure 3:
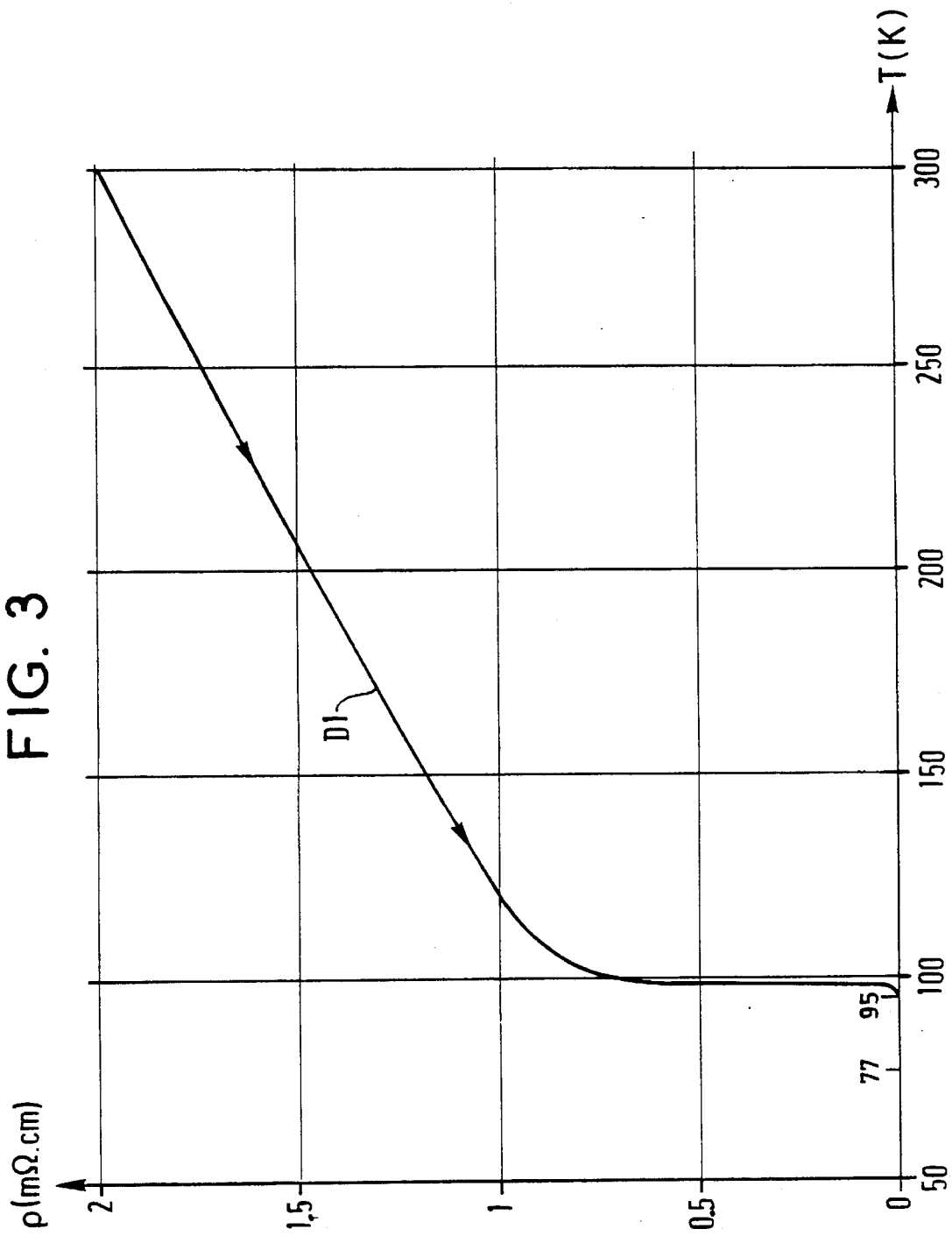
FIG. 3 is a graph showing how the resistivity of the material of FIGS. 1 and 2 varies as a function of temperature T (K)

The resistivity p(mΩ.cm) of the material was measured as a function of temperature T (K). Curve D1 of FIG. 3 was obtained. It can be seen that the transition takes place around 100K, with zero resistance being effective at 95K.

EXAMPLE II

Figure 4:
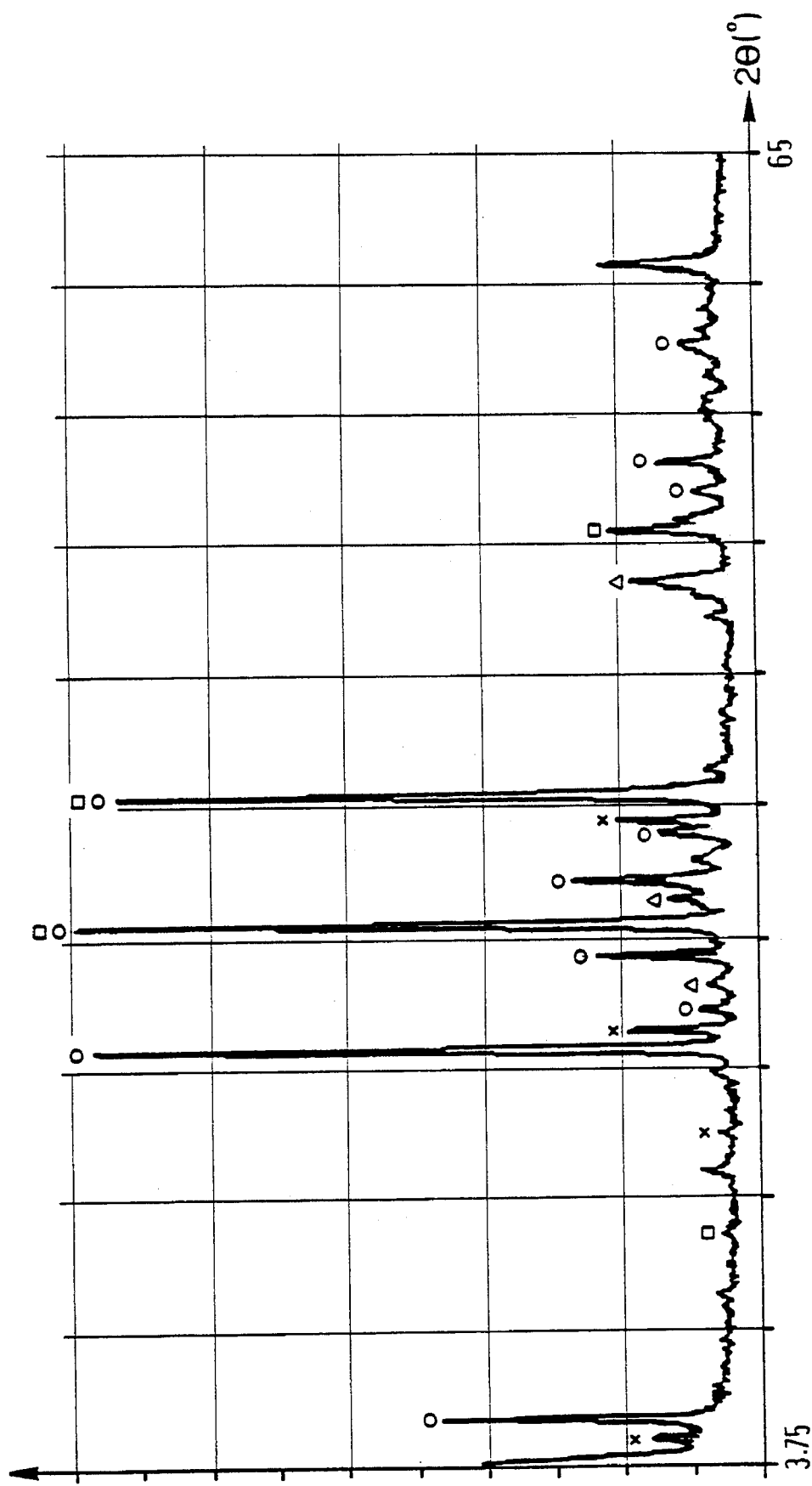
FIG. 4 is analogous to FIG. 2 and corresponds to a material not subjected to the monitoring method of the invention.

This example was identical to the preceding example except for the treatment temperature which was maintained at 840° C. for 2 hours: instead of decreasing, resistivity rose from 15 mΩ.cm to 280 mΩ.cm. After cooling, the bar looked as though it had melted with gold-colored acicular crystals appearing on the surface. It adhered to the support. There was no significant decrease in the resistivity of the bar after being retreated at 830° C. for 120 hours under 10% oxygen. Its final composition as shown by X-ray diffraction (cf. the spectrum of FIG. 4) indicates a tiny fraction of the phase $$Bi_2Sr_2Ca_2Cu_3O_{10} \text{ (x)}$$

in a mixture of:

$Bi_2Sr_2CaCu_2O_8$ (o)

$Bi_2Sr_2CuO_6$ (Δ)

$Ca_2CuO_3$ (□)

This example shows the irreversible nature of decomposition by melting: the only way of continuing with synthesis of the 100K phase is to grind up the sample that has melted, to shape it again, and to retreat it under the conditions of Example I, i.e. to return to the starting point.

EXAMPLE III

This example was identical to Example I except that the treatment atmosphere contained no more than 5% oxygen, thereby having the effect of reducing the melting point of the copper-rich meltable phases. The resistivity turning point was then situated around 810° C. Consequently, after a brief excursion to about 830° C., synthesis was performed at 820° C. for 75 hours. The resulting product was constituted by more than 85% $Bi_2Sr_2Ca_2Cu_3O_{10}$ in the form of crystals of large size: 15 μm to 20 μm.

EXAMPLE IV

This example was identical to Example I, except for the starting composition: 10% by weight of silver powder was added to the specified precursors. As for Example III, the treatment temperature turned out to be about 10° C. lower. The resulting product was also rich in the 110K phase, but the crystals were smaller in size, being less than 10 μm.

EXAMPLE V

The product synthesized in Example I was crushed between the rollers of a rolling mill in a plurality of passes down to a thickness of 0.5 mm. A strip of 30 mm×5 mm×0.5 mm was cut out from the material rolled in this way.

Figure 5:
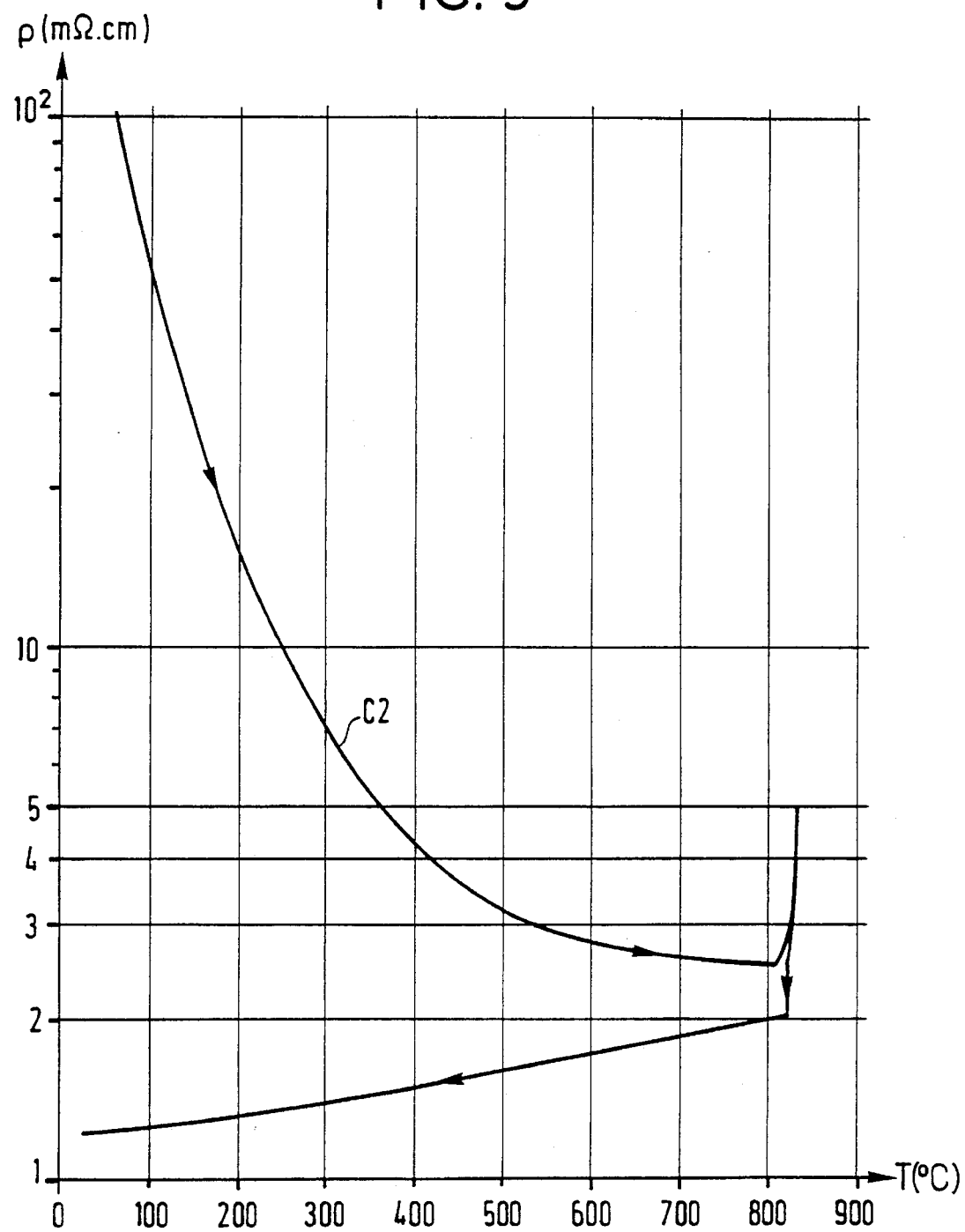
FIG. 5 shows how resistivity in another material treated by the method of the invention varies as a function of temperature.

The strip was retreated by the method of the invention. Curve C2 in FIG. 5 shows how its resistivity varied as a function of temperature.

Its resistivity p which had gone from 2 mΩ.cm to 500 mΩ.cm after rolling and shaping, decreased rapidly as a function of temperature and a turning point began at 810° C. After a short excursion to 835° C. the temperature was brought down to 820° C. and maintained for 40 hours at this value. The return to ambient was performed at 120° C. per hour under pure oxygen. The resulting product was more dense and better textured than the starting product and it had retained its purity because of the in situ monitoring of its resistivity which made it possible to avoid irreversible decomposition by melting.

Naturally the invention is not limited to the implementations described above. Without going beyond the ambit of the invention, it is possible to replace any means by equivalent means.

I claim:

1. A method of fabricating a superconductive material comprising a superconductive phase represented by:

$$(BP)_2Sr_2Ca_nCu_{(1+n)}O_{(6+2n)}$$

where
BP=Bi; $Bi_{(1-x)}Pb_x$
n=2
comprising the steps of:
(a) providing a starting material that is a mixture of powders of precursors for said material having stoichiometric proportions appropriate for the desired superconductive phase;
(b) agglomerating said mixture to form a tubular or a cylindrical piece;
(c) placing the agglomerated piece in a controlled-atmosphere oven for synthesizing said superconductive phase;
(d) continuously measuring the conductivity of said piece;
(e) increasing the oven temperature to thereby increase conductivity of the piece;
(f) further increasing the oven temperature to exceed a value at which conductivity of the piece begins to decrease and at which temperature the piece begins to partially melt;
(g) stopping the rise in oven temperature and setting the oven temperature to a value at which conductivity of the piece again increases to thereby synthesize the superconductive phase; and then
(h) repeating steps (e) to (g) one or more times to progressively purify and complete synthesis of the superconductive phase; and then
(i) cooling the piece to ambient temperature to recover the superconductive material.

2. A method according to claim 1, wherein said precursors are selected from:

$BaCO_3$ $SrCO_3$ $CaCO_3$ or $CaO$ $Bi_2(CO_3)_3$ or $Bi_2O_3$ $PbCO_3$ or $PbO$ or $Pb_3O_4$.

3. A method according to claim 1, wherein said conductivity is measured by the "four point" method using four contacts.

4. A method according to claim 3, wherein said contacts are made of a material selected from the group consisting of silver, platinum, rhodium and gold.

5. A method according to claim 3, wherein said contacts are made in the form of varnish on the surface of said piece, wires embedded in said piece, or collars or springs pressing against said piece.

* * * * *